(12) United States Patent
Yu

(10) Patent No.: US 12,170,880 B2
(45) Date of Patent: *Dec. 17, 2024

(54) LOUDSPEAKER ARRAY PASSIVE ACOUSTIC CONFIGURATION PROCEDURE

(71) Applicant: Biamp Systems, LLC, Beaverton, OR (US)

(72) Inventor: Xian Yu, Bryn Mawr, PA (US)

(73) Assignee: Biamp Systems, LLC, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/487,952

(22) Filed: Oct. 16, 2023

(65) Prior Publication Data

US 2024/0048930 A1 Feb. 8, 2024

Related U.S. Application Data

(63) Continuation of application No. 18/159,080, filed on Jan. 24, 2023, now Pat. No. 11,832,081, which is a
(Continued)

(51) Int. Cl.
*H04S 7/00* (2006.01)
*G10L 19/008* (2013.01)
(Continued)

(52) U.S. Cl.
CPC ............... *H04S 7/30* (2013.01); *G10L 19/008* (2013.01); *G10L 19/04* (2013.01); *H04R 1/403* (2013.01);
(Continued)

(58) Field of Classification Search
CPC ..... H04S 7/30; H04S 2420/03; G10L 19/008; G10L 19/04; H04R 1/403; H04R 3/12; H04R 5/02
See application file for complete search history.

(56) References Cited

U.S. PATENT DOCUMENTS 6,151,571 A 11/2000 Pertrushin
8,750,542 B2 6/2014 Thompson
(Continued)

OTHER PUBLICATIONS

International Search Report and Written Opinion issued in the international application No. PCT/US22/13023, mailed on Apr. 14, 2022.
(Continued)

*Primary Examiner* — David L Ton

(57) ABSTRACT

An example method of operation includes identifying a loudspeaker array profile defining characteristics of a loudspeaker array stored in memory, identifying a three-dimensional venue geometry value stored in the memory, defining virtual receivers to simulate acoustic characteristics within the venue geometry, defining a number of passive acoustic filter permutations to perform within a range of passive acoustic filter settings, and each passive acoustic filter setting is unique and has one or more passive acoustic filters to apply to one or more loudspeakers in the loudspeaker array, selecting performance criteria to apply to the loudspeaker array to represent its sound coverage uniformity at a given location throughout the venue geometry, calculating the performance criteria of the loudspeaker array via a passive acoustic filter setting selected from one or more of the passive acoustic filter permutations by performing a simulation with the passive acoustic filter settings, identifying an optimized passive acoustic filter setting from a specific permutation, with which the loudspeaker array achieves optimal uniform sound coverage in the venue geometry, and applying the optimized passive acoustic filter setting to the loudspeaker array.

20 Claims, 17 Drawing Sheets

Related U.S. Application Data continuation of application No. 17/390,555, filed on Jul. 30, 2021, now Pat. No. 11,564,052.

(60) Provisional application No. 63/139,801, filed on Jan. 21, 2021, provisional application No. 63/139,802, filed on Jan. 21, 2021.

(51) Int. Cl.
*G10L 19/04* (2013.01)
*H04R 1/40* (2006.01)
*H04R 3/12* (2006.01)
*H04R 5/02* (2006.01)

(52) U.S. Cl.
CPC ............... *H04R 3/12* (2013.01); *H04R 5/02* (2013.01); *H04S 2420/03* (2013.01)

(56) References Cited

U.S. PATENT DOCUMENTS

| | | |
|---|---|---|
| 11,070,932 B1 | 7/2021 | Prospero et al. |
| 2007/0185719 A1 | 8/2007 | Miyazaki |
| 2008/0144864 A1 | 6/2008 | Huon |
| 2010/0232635 A1 | 9/2010 | Miyazaki et al. |
| 2010/0322445 A1 | 12/2010 | Jakowski |
| 2014/0098966 A1 | 4/2014 | Corteel et al. |
| 2016/0050508 A1 | 2/2016 | Redmann |
| 2018/0007456 A1 | 1/2018 | Spillmann et al. |
| 2018/0027350 A1 | 1/2018 | Buerger et al. |
| 2019/0191241 A1 | 6/2019 | Maeno et al. |
| 2019/0394598 A1 | 12/2019 | Moore |
| 2020/0221217 A1 | 7/2020 | Kim et al. |

OTHER PUBLICATIONS

Extended European Search Report issued in the EP Patent Application No. 22743130.1, mailed on Jun. 5, 2024.

Feistel et al., "Adapting Loudspeaker Array Radiation to the Venue using Numerical Optimization of FIB Filters", Audio Engineering Society Convention Paper 8937, presented at the 135th Convention Oct. 17-20, 20223, New York, NY, USA.

Unknown, "Ease Focus Version 2", Mar. 31, 2014, XP055489026, https://vue-audiotechnik.com/ease-focus-acoustic-modeling-software/.

500

| 514 | 516 | | 522 | 524 |

512

| # | Cabinet | Angle | HF Attn. (dB) | Box Attn. (dB) |
|---|---|---|---|---|
| 1 | IV6-1122/05 | 2.5° | 0 | 0 |
| 2 | IV6-1122/05 | 2.5° | 0 | 0 |
| 3 | IV6-1122/05 | 2.5° | 0 | 0 |
| 4 | IV6-1122/05 | 2.5° | 0 | 0 |
| 5 | IV6-1122/05 | 2.5° | 0 | 0 |
| 6 | IV6-1122/05 | 2.5° | -1.5 | 0 |
| 7 | IV6-1122/05 | 5.0° | 0 | 0 |
| 8 | IV6-1122/05 | 5.0° | 0 | -1.5 |
| 9 | IV6-1122/05 | 5.0° | -3.0 | -1.5 |
| 10 | IV6-1122/15 | 10.0° | 0 | 0 |

Start | Array | Loads

Recommended Array Configuration

Frame Vertical Angle [°] 8.5

Array not synced. Please change Box Count to 10 in EF3.

| !"#$%&'(#) | *+,"#-%!#""+'. | !"(%/(01 | Σ 23%*+,"#-%&'( |
|---|---|---|---|
| ! | "!#"!#"!#"!#$ | %&' | !(!(!(!)! |
| % | "!#"!#"!#"%#$ | %&* | !(!(!(%)% |
| + | "!#"!#"%#"%#$ | %&, | !(!(%(%)+ |
| - | "!#"!#"%#"+#$ | %&+ | !(!(%(+)- |
| . | "!#"!#"+#"+#$ | %&! | !(!(+(+). |
| / | "!#"%#"+#"+#$ | !&0 | !(%(+(+)/ |
| , | "!#"%#"+#"-#$ | !&* | !(%(+(-), |
| * | "!#"%#"-#"-#$ | !&/ | !(%(-(-)* |

| | | 4%23%056#%7$#-5"+2'6%%/%89:;%1 | |
|---|---|---|---|
| 1$23$456789:;$"{ <=:7>7?5:728$@AB2C7:I  EC5F7:7285A$G9:D2F | | | |
| | . | %!0 | %!H!!! |
| | / | %0! | %!!H!!! |
| | , | +*! | %H!!!H!!! |
| | * | -*0 | %!H!!!H!!! |
| | 0 | /!. | %!!H!!!H!!! |
| | ' | ,.0 | %H!!!H!!!H!!! |
| | %! | 0%! | %!H!!!H!!!H!!! |

IDENTIFYING A LOUDSPEAKER ARRAY PROFILE DEFINING CHARACTERISTICS OF A LOUDSPEAKER ARRAY STORED IN MEMORY
1102

IDENTIFYING A THREE-DIMENSIONAL VENUE GEOMETRY VALUE STORED IN THE MEMORY
1104

DEFINING A PLURALITY OF VIRTUAL RECEIVERS TO SIMULATE ACOUSTIC CHARACTERISTICS WITHIN THE VENUE GEOMETRY
1106

DEFINING A NUMBER OF PASSIVE ACOUSTIC FILTER PERMUTATIONS TO PERFORM WITHIN A RANGE OF PASSIVE ACOUSTIC FILTER SETTINGS, WHEREIN EACH PASSIVE ACOUSTIC FILTER SETTING IS UNIQUE AND COMPRISES ONE OR MORE PASSIVE ACOUSTIC FILTERS TO APPLY TO ONE OR MORE LOUDSPEAKERS IN THE LOUDSPEAKER ARRAY
1108

SELECTING PERFORMANCE CRITERIA TO APPLY TO THE LOUDSPEAKER ARRAY TO REPRESENT ITS SOUND COVERAGE UNIFORMITY AT A GIVEN LOCATION THROUGHOUT THE VENUE GEOMETRY
1110

CALCULATING THE PERFORMANCE CRITERIA OF THE LOUDSPEAKER ARRAY VIA A PASSIVE ACOUSTIC FILTER SETTING SELECTED FROM ONE OR MORE OF THE PASSIVE ACOUSTIC FILTER PERMUTATIONS BY PERFORMING A SIMULATION WITH THE PASSIVE ACOUSTIC FILTER SETTINGS
1112

IDENTIFYING AN OPTIMIZED PASSIVE ACOUSTIC FILTER SETTING FROM A SPECIFIC PERMUTATION, WITH WHICH THE LOUDSPEAKER ARRAY ACHIEVES OPTIMAL UNIFORM SOUND COVERAGE IN THE VENUE GEOMETRY
1114

APPLYING THE OPTIMIZED PASSIVE ACOUSTIC FILTER SETTING TO THE LOUDSPEAKER ARRAY
1116

FIG. 11

LOUDSPEAKER ARRAY PASSIVE ACOUSTIC CONFIGURATION PROCEDURE

CROSS-REFERENCE TO RELATED APPLICATIONS

This application is a continuation of U.S. patent application Ser. No. 18/159,080, filed on Jan. 24, 2023, which is a continuation of U.S. patent application Ser. No. 17/390,555, filed on Jul. 30, 2021, now U.S. Pat. No. 11,564,052, issued on Jan. 24, 2023, which claims priority to earlier filed U.S. patent provisional application Nos. 63/139,801 and 63/139,802, both entitled, "LOUDSPEAKER ARRAY PASSIVE ACOUSTIC OPTIMIZATION," and filed on Jan. 21, 2021, the entire contents of which are hereby incorporated by reference.

BACKGROUND

Speakers and their installation on ceilings and walls and other places may raise a degree of concern with how quickly they can be setup and secured. Also, the acoustic fingerprint in a particular environment will vary depending on the environment size and anatomy. Utilizing feedback and sounds to calibrate an environment can be helpful in tuning a number of speakers, speaker types, speaker angles, positions, output amplitude, angles, etc. However, feedback and calibration are not always easy to perform especially by someone without the proper training. Performing a pre-installation analysis of the environment anatomy by a modeling algorithm to identify fundamental design considerations may optimize the audio setup process.

Additionally, directivity functions for real multi-way loudspeaker systems are complicated to predict. Polar plots taken from a radiation pattern are used to measure an environment at different frequencies. The audience area of a particular environment or a specific portion of that area is generally the target radiation pattern desired to uniformly distribute audio signals. The intensity level in any direction must counteract the distance of the audience from the loudspeaker (further seats require louder signals). Sound intensity falls inversely with the distance from the source as denoted by the inverse square law (ISL), which is expressed in decibels (dB) sound pressure level (SPL) [20*log(distance/reference)].

A loudspeaker array has many degrees of freedom allowing the overall directivity function to be manipulated and reshaped. A single loudspeaker typically has a less consistent directivity shape as a function of frequency than an array can achieve. As a result, a simple loudspeaker typically cannot sustain a usable frequency response over a desired range. Certain degrees of freedom within an array may include orientation/location of the array, a number of elements, a type/directivity of each element, a splay angle between elements and a magnitude and phase per frequency of each element.

To perform a calculation or an analysis of the acoustical performance of an array, the mechanical structure of the array must be identified, such as the location and orientation of each array element. To simulate a model of an ideal array would require tremendous permutations to accommodate the number of degrees of freedom possible for the array configuration.

SUMMARY

One example embodiment may provide identifying a number of selected speakers from a stored value, identifying the types of speakers, identifying the splay angles associated with the speakers, selecting one or more digital filters to apply to the one or more speakers, performing a number of filter permutations dependent on a number of speakers, and ranking one or more results of the filter permutations according to calculated permutations.

Another example embodiment may provide identifying a venue geometry from a stored value, determining a venue polar representation based on the venue geometry, selecting one or more loudspeaker types to place in the venue based on the venue geometry and one or more target sound pressure levels (SPLs), selecting one or more locations in the venue to place the one or more loudspeakers, identifying one or more angles to position the one or more loudspeakers in the venue at the selected locations, and generating a display model of a loudspeaker arrangement comprising a selected number of speakers and one or more filters to apply to the one or more loudspeakers.

Still another example embodiment may include an apparatus that includes a processor configured to identify a venue geometry from a stored value, determine a venue polar representation based on the venue geometry, select one or more loudspeaker types to place in the venue based on the venue geometry and one or more target sound pressure levels (SPLs), select one or more locations in the venue to place the one or more loudspeakers, identify one or more angles to position the one or more loudspeakers in the venue at the selected locations, and generate a display model of a loudspeaker arrangement comprising a selected number of speakers and one or more filters to apply to the one or more loudspeakers.

Another example embodiment may include a non-transitory computer readable storage medium configured to store instructions that when executed cause a processor to perform identifying a venue geometry from a stored value, determining a venue polar representation based on the venue geometry, selecting one or more loudspeaker types to place in the venue based on the venue geometry and one or more target sound pressure levels (SPLs), selecting one or more locations in the venue to place the one or more loudspeakers, identifying one or more angles to position the one or more loudspeakers in the venue at the selected locations, and generating a display model of a loudspeaker arrangement comprising a selected number of speakers and one or more filters to apply to the one or more loudspeakers.

Still another example embodiment may include a method that includes identifying a loudspeaker array profile defining characteristics of a loudspeaker array stored in memory, identifying a three-dimensional venue geometry value stored in the memory, defining a plurality of virtual receivers to simulate acoustic characteristics within the venue geometry, defining a number of passive acoustic filter permutations to perform within a range of passive acoustic filter settings, wherein each passive acoustic filter setting is unique and comprises one or more passive acoustic filters to apply to one or more loudspeakers in the loudspeaker array, selecting performance criteria to apply to the loudspeaker array to represent its sound coverage uniformity at a given location throughout the venue geometry, calculating the performance criteria of the loudspeaker array via a passive acoustic filter setting selected from one or more of the passive acoustic filter permutations by performing a simulation with the passive acoustic filter settings, and identifying an optimized passive acoustic filter setting from a specific permutation, with which the loudspeaker array achieves optimal uniform sound coverage in the venue geometry; and applying the optimized passive acoustic filter setting to the loudspeaker array.

Still yet another example embodiment may include an apparatus that includes a processor configured to identify a loudspeaker array profile defining characteristics of a loudspeaker array stored in memory, identify a three-dimensional venue geometry value stored in the memory, define a plurality of virtual receivers to simulate acoustic characteristics within the venue geometry, define a number of passive acoustic filter permutations to perform within a range of passive acoustic filter settings, wherein each passive acoustic filter setting is unique and comprises one or more passive acoustic filters to apply to one or more loudspeakers in the loudspeaker array, select performance criteria to apply to the loudspeaker array to represent its sound coverage uniformity at a given location throughout the venue geometry, calculate the performance criteria of the loudspeaker array via a passive acoustic filter setting selected from one or more of the passive acoustic filter permutations by performing a simulation with the passive acoustic filter settings, and identify an optimized passive acoustic filter setting from a specific permutation, with which the loudspeaker array achieves optimal uniform sound coverage in the venue geometry, and apply the optimized passive acoustic filter setting to the loudspeaker array.

Another example embodiment may include a non-transitory computer readable storage medium configured to store instructions that when executed cause a processor to perform identifying a loudspeaker array profile defining characteristics of a loudspeaker array stored in memory, identifying a three-dimensional venue geometry value stored in the memory, defining a plurality of virtual receivers to simulate acoustic characteristics within the venue geometry, defining a number of passive acoustic filter permutations to perform within a range of passive acoustic filter settings, and each passive acoustic filter setting is unique and comprises one or more passive acoustic filters to apply to one or more loudspeakers in the loudspeaker array, selecting performance criteria to apply to the loudspeaker array to represent its sound coverage uniformity at a given location throughout the venue geometry, calculating the performance criteria of the loudspeaker array via a passive acoustic filter setting selected from one or more of the passive acoustic filter permutations by performing a simulation with the passive acoustic filter settings, identifying an optimized passive acoustic filter setting from a specific permutation, with which the loudspeaker array achieves optimal uniform sound coverage in the venue geometry, and applying the optimized passive acoustic filter setting to the loudspeaker array.

BRIEF DESCRIPTION OF THE DRAWINGS

FIG. 5 illustrates a loudspeaker array configuration user interface according to example embodiments.

FIG. 8 illustrates a table user interface for identifying and calculating filter settings and reducing permutations according to example embodiments.

FIG. 9 illustrates another table user interface for identifying and calculating filter settings and reducing permutations according to example embodiments.

FIG. 11 illustrates a flow diagram for a loudspeaker array configuration according to example embodiments.

DETAILED DESCRIPTION

Figure 1A:
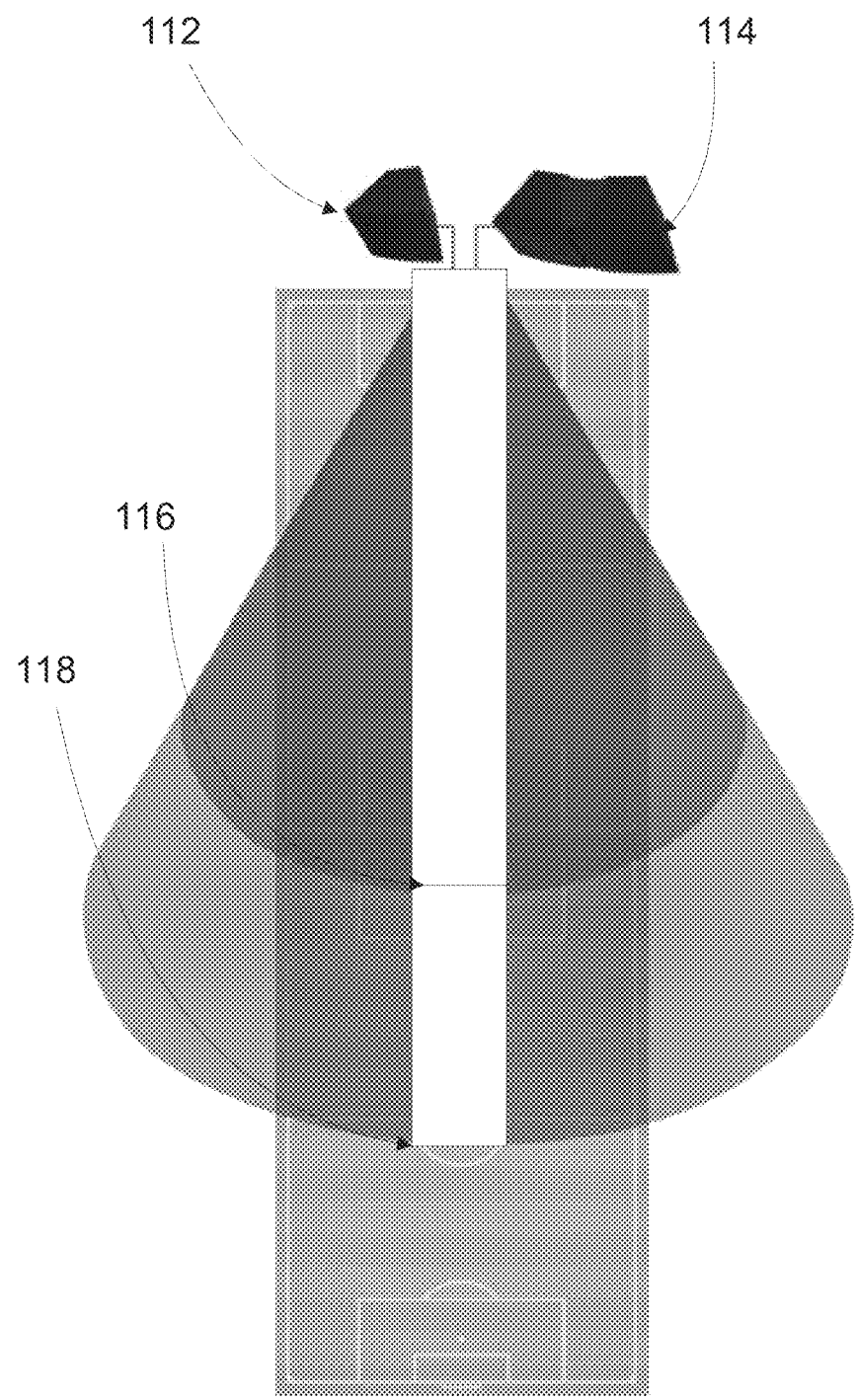
FIG. 1A illustrates a venue loudspeaker configuration user interface according to example embodiments.

It will be readily understood that the instant components, as generally described and illustrated in the figures herein, may be arranged and designed in a wide variety of different configurations. Thus, the following detailed description of the embodiments of at least one of a method, apparatus, non-transitory computer readable medium and system, as represented in the attached figures, is not intended to limit the scope of the application as claimed, but is merely representative of selected embodiments.

The instant features, structures, or characteristics as described throughout this specification may be combined in any suitable manner in one or more embodiments. For example, the usage of the phrases "example embodiments", "some embodiments", or other similar language, throughout this specification refers to the fact that a particular feature, structure, or characteristic described in connection with the embodiment may be included in at least one embodiment. Thus, appearances of the phrases "example embodiments", "in some embodiments", "in other embodiments", or other similar language, throughout this specification do not necessarily all refer to the same group of embodiments, and the described features, structures, or characteristics may be combined in any suitable manner in one or more embodiments.

In addition, while the term "message" may have been used in the description of embodiments, the application may be applied to many types of network data, such as, packet, frame, datagram, etc. The term "message" also includes packet, frame, datagram, and any equivalents thereof. Furthermore, while certain types of messages and signaling may be depicted in exemplary embodiments they are not limited to a certain type of message, and the application is not limited to a certain type of signaling.

Example embodiments provide a speaker configuration simulator that receives various goals/objectives or target values to establish an initial speaker setup criteria, and also receives as input the geometry/anatomy of a particular environment. The resulting output of the software application simulator is a number of loudspeakers, types of loudspeakers, angles and positions of the loudspeakers and an audio visualization of how the audio would likely appear as it propagates throughout the environment. Certain considerations may be used to determine the rank of various speaker/cabinets. For example, how many cabinets are included, the type of speakers/drivers, the inter-cabinet angle or splay angles and directivity angles associated with the speakers, then the various filter choices may also be applied. The internal speaker components will be refereed to as drivers for purposes of this discussion as parts of a loudspeaker assembly.

Example embodiments provide a speaker configuration and optimization simulation application that generates potential loudspeaker configurations and ideal output criteria. Also, certain graphical user interfaces provide a visual realization of the multi-driver loudspeaker and/or loudspeaker arrays. By applying a finite impulse response (FIR) filter to each driver or group of drivers which drive the loudspeaker(s), the ideal configuration and output can be achieved based on the desired design objectives. Also, the filter type may include passive acoustic filters according to example embodiments.

The desired loudspeaker configuration generally depends on the geometry of a particular venue. For example, venues with flat floors such as transportations, cathedrals, mosques, etc. need a narrower polar pattern, venues with raked seating planes and balconies such as theaters, lecture halls, congresses, etc. need a wider loudspeaker polar pattern. A venue may also require different loudspeaker polar patterns depending on the use-cases. The loudspeaker configuration and optimized use case can be designed to accommodate such venue requirements. Referring to FIG. 1C, the loudspeaker system can be optimized for lower seating only 162 and not upper seating 160, or for both lower 168 and upper seating 166. The settings for different use-cases can be controlled electronically by applying unique FIR filters and/or passive acoustic filters to each driver within the loudspeaker cabinet.

FIG. 1A illustrates a multi-loudspeaker configuration for a particular venue according to example embodiments. Referring to FIG. 1A, the example provides a single loudspeaker array (single cabinet) 112 combined with a dual loudspeaker array (dual cabinet) 114 as a potential loudspeaker implementation for a particular venue having a particular venue geometry. The rated values may be, for example, 96 dB at 158 meters for the dual cabinet as denoted by the second line 118, and 96 dB at 112 meters for the single cabinet as denoted by the first line 116. The modeling required to identify the venue objectives can provide loudspeaker driver configurations for applying select filters and generating a polar output pattern which is ideal for certain geometries and desired angles to be applied to the venue audio.

Figure 1B:
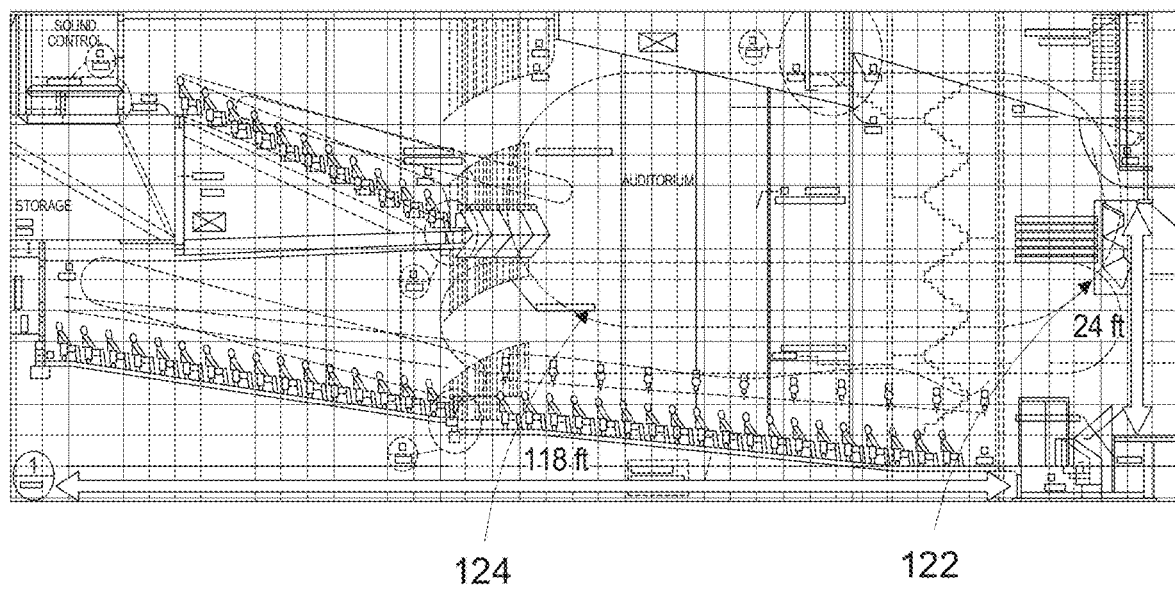
FIG. 1B illustrates a venue with a complex geometry according to example embodiments.
Figure 1C:
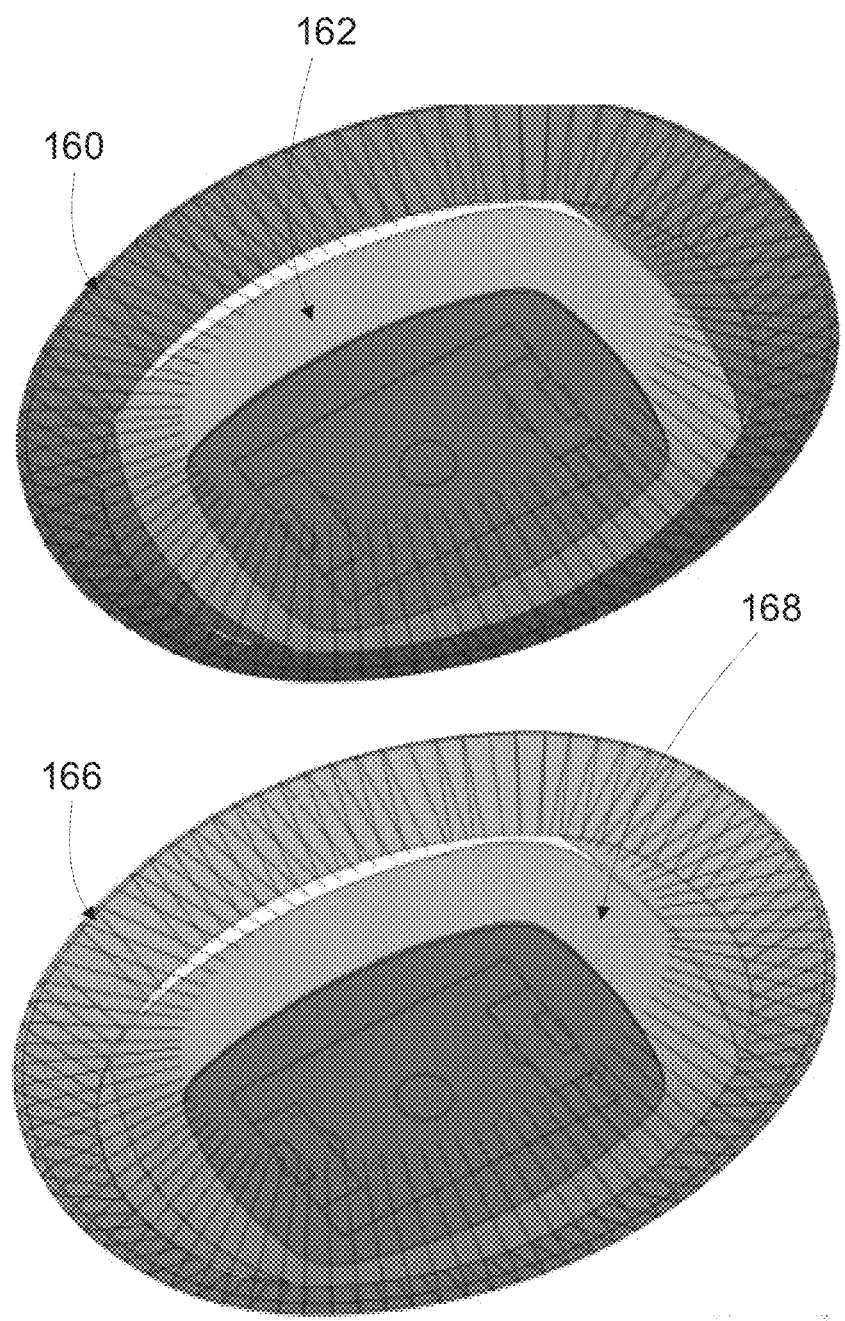
FIG. 1C illustrates a venue loudspeaker configuration area according to example embodiments.
Figure 1D:
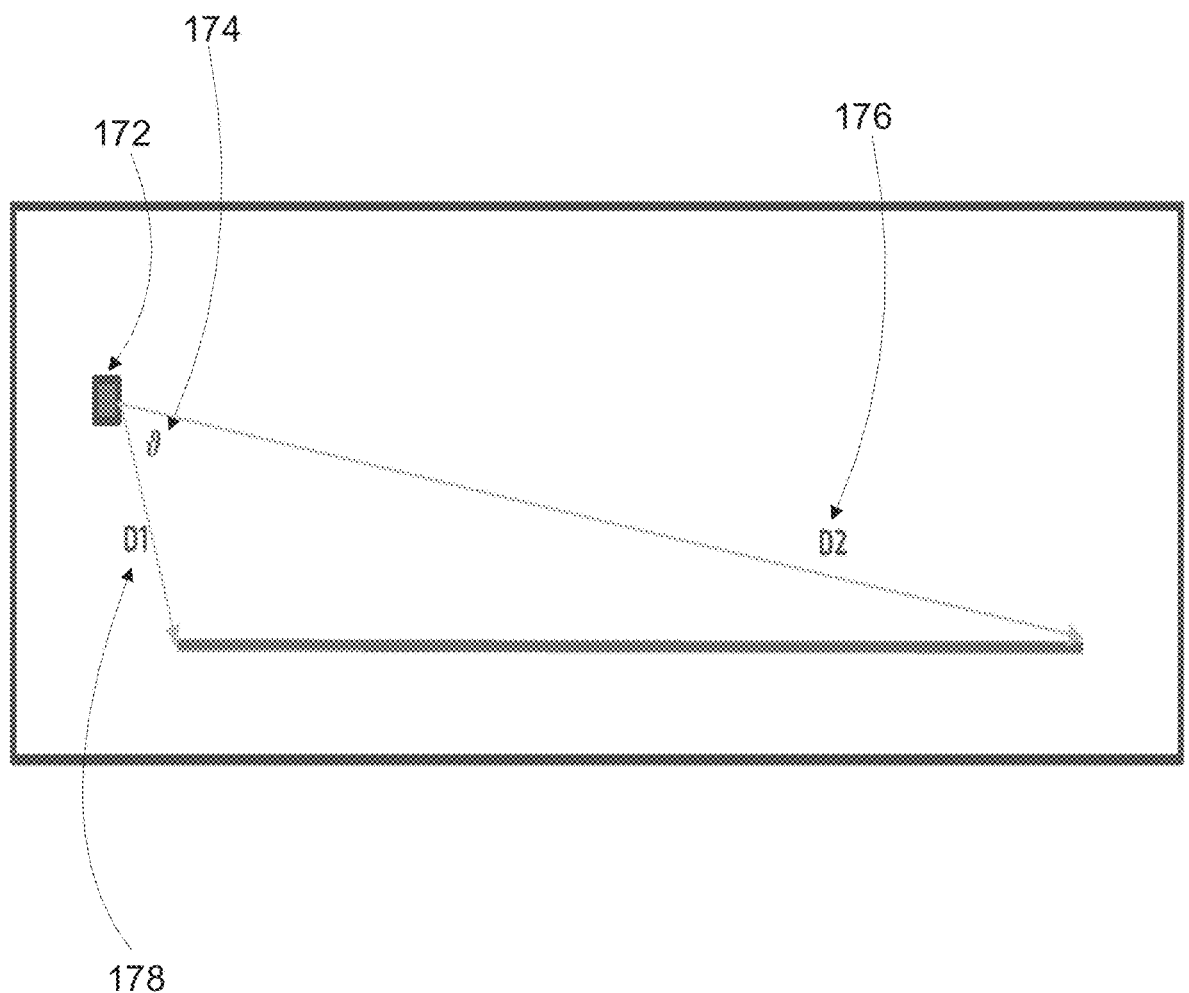
FIG. 1D illustrates a fundamental venue loudspeaker distance area according to example embodiments.

FIG. 1B illustrates a venue geometry 150 with various area which need to be identified when configuring and optimizing a loudspeaker arrangement. The loudspeaker(s) 122 may be disposed on a wall or attachable surface and aimed at a venue geometry 124 to optimize the audio output potential. FIG. 1D illustrates a simple venue geometry 170 with a loudspeaker location 172 and a distance D1 178 from the front row to the loudspeaker 172 and a distance D2 176 from a last row to the loudspeaker 172. The angle 'theta' 174 represents the angle between the distances D1 and D2.

Figure 1E:
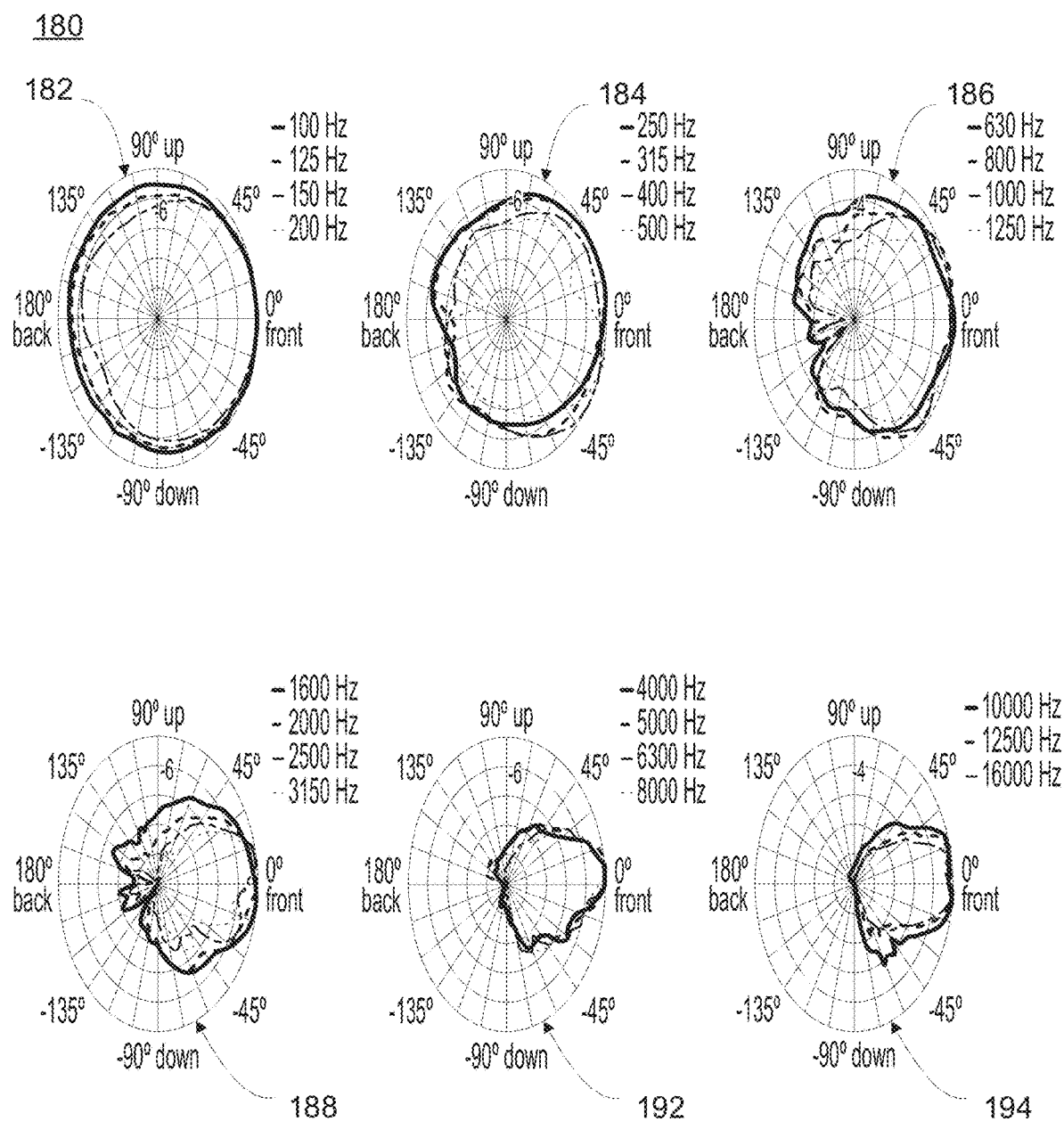
FIG. 1E illustrates variety of different venue polar configurations with varying frequencies according to example embodiments.

FIG. 1E illustrates example polar geometries 180. The lower frequencies 100-200 Hz have almost perfectly circular geometries 182 as the frequency starts to increase the polar patterns start to shrink. Frequencies 250-500 Hz 184 and 630-1250 Hz 186 demonstrate the convergence of the pattern. The patterns continue to shrink for frequencies 1600-3750 Hz 188, 4000-8000 Hz 192 and ultimately high frequencies 10000 Hz-16000 Hz 194.

Figure 2A:
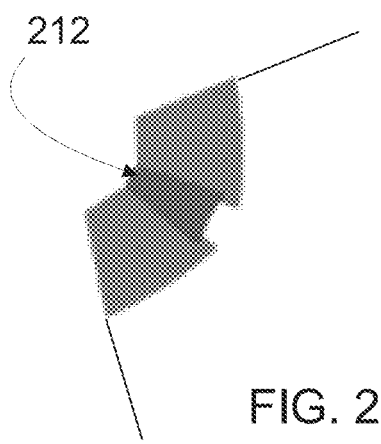
FIGS. 2A-2C illustrate various speaker cabinet arrays and varying splay angles according to example embodiments.
Figure 2B:
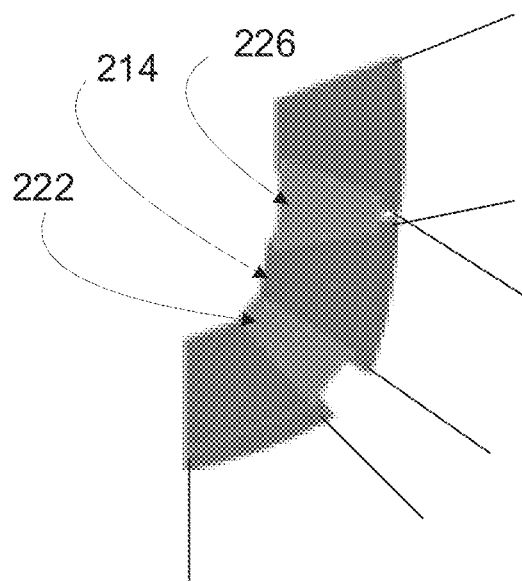
Figure 2C:
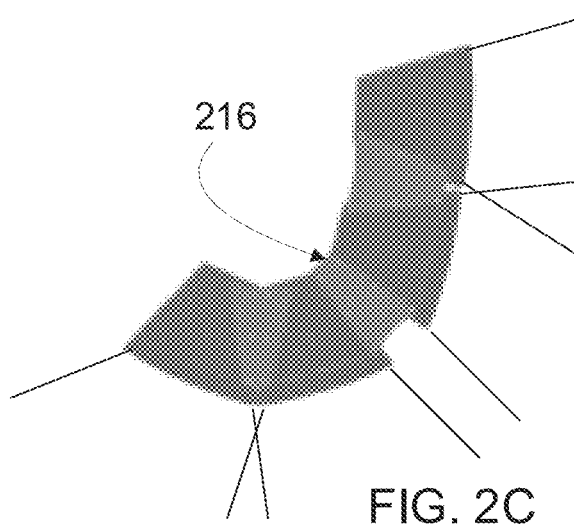

FIG. 2A illustrates a dual loudspeaker array configuration according to example embodiments. Referring to FIG. 2A, the example two speaker array 212 is illustrated as having a particular splay plate which defines the angles between the loudspeakers and their relative position when mounted from a wall or the ceiling (i.e., splay angles). The splay angles in the array 214 of FIG. 2B includes a smaller splay angle 222 set by a smaller splay angle and a larger splay angle 226 defined by a larger splay plate. The total number of loudspeakers may include three in this example. In FIG. 2C, a quadruple loudspeaker array configuration 216 is illustrated with three different splay angles.

Figure 3A:
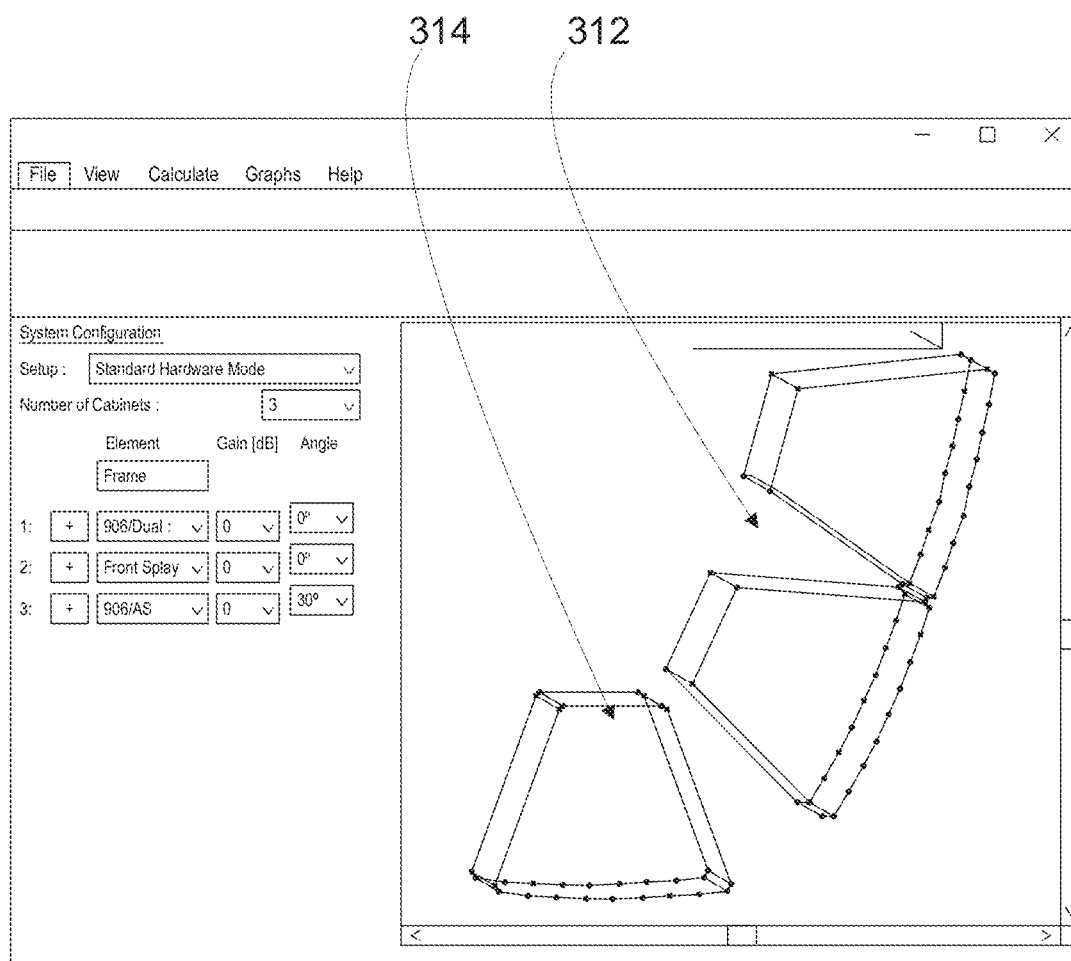
FIG. 3A illustrates an example graphical user interface of a loudspeaker array configuration according to example embodiments.

FIG. 3A illustrates an example loudspeaker array model according to example embodiments. Referring to FIG. 3A, the modeling application demonstrates cabinet size, position, splay angle, and other information, which may be setup in a simulation process for creating a polar pattern output signal. The coverage patterns sought may be achieved by selecting certain loudspeaker models from memory which log the output characteristics of the loudspeakers along with possible mounting brackets array configuration data. The basic array information may include cabinet type 314 (loudspeaker model) aiming angle (angle with respect to the venue geometry) and splay angle 312 (angle between one or more loudspeakers). The use of multiple drivers for a set of speakers (within one or more loudspeakers) and amplifier channels provides the ability to beamform a wide range of vertical patterns from varying cabinet configurations. Varying the phase and/or amplitude of the driver pairs with linear phase finite impulse response (FIR) filters, the vertical patterns are created. Most vertical coverage angles desired are between 20 and 100 degrees with the majority of designs being closer to 40 degrees.

Figure 3B:
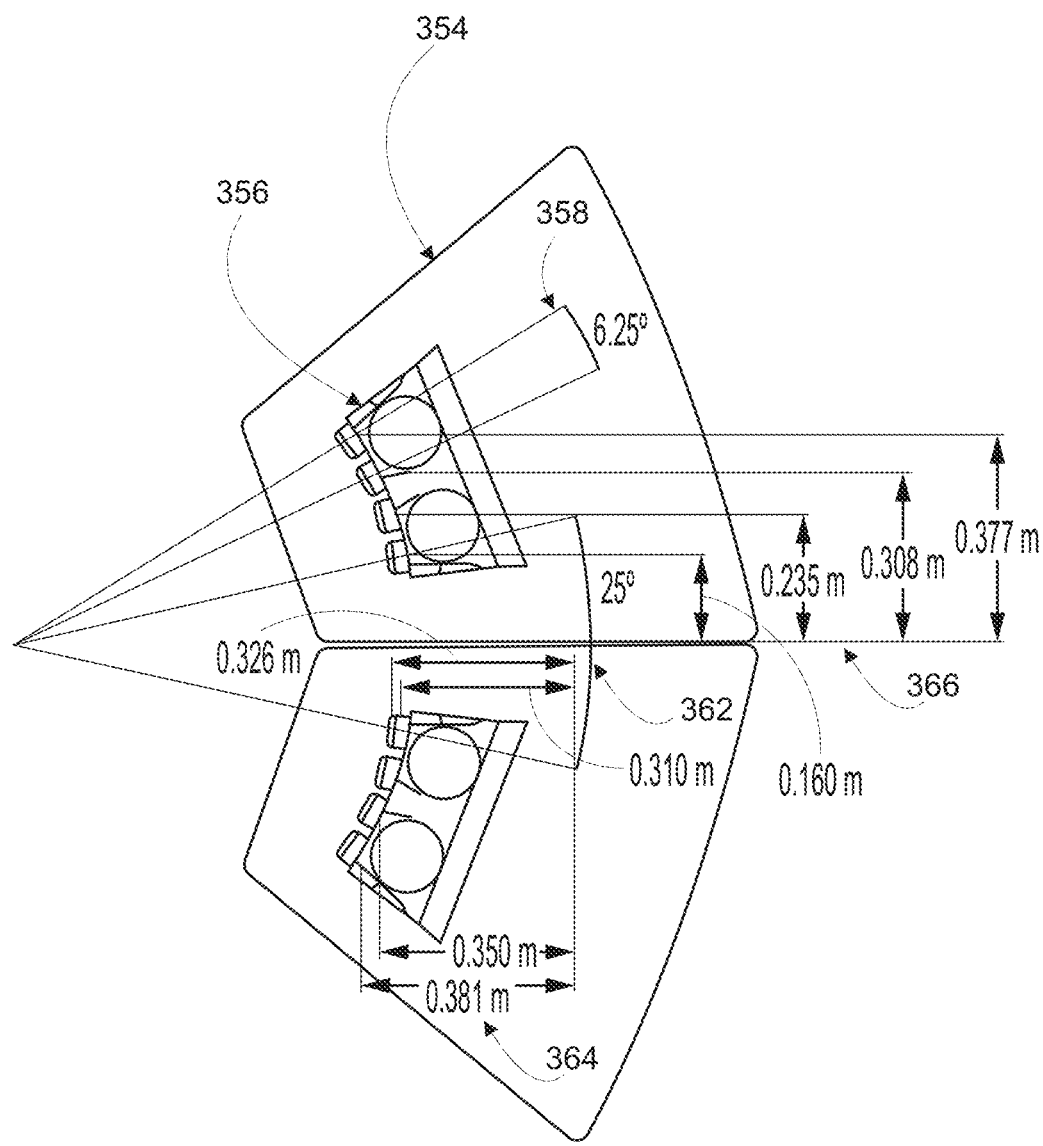
FIG. 3B illustrates a detailed loudspeaker array cabinet configuration according to example embodiments.

FIG. 3B illustrates a detailed loudspeaker array model with position specifications and aiming angles according to example embodiments. Referring to FIG. 3B, the dual-cabinet configuration 350 includes cabinets 354 with driver placement 356 according to specific driver placement angles 358. The y-axis positions 366 are illustrated along with a certain aiming angle 362. The x-axis positions 364 are also illustrated for accurate driver placement. The angles between the cabinets are splay angles. The placement position of the drivers is the basis for calculating the spacing of the drivers.

Figure 4:
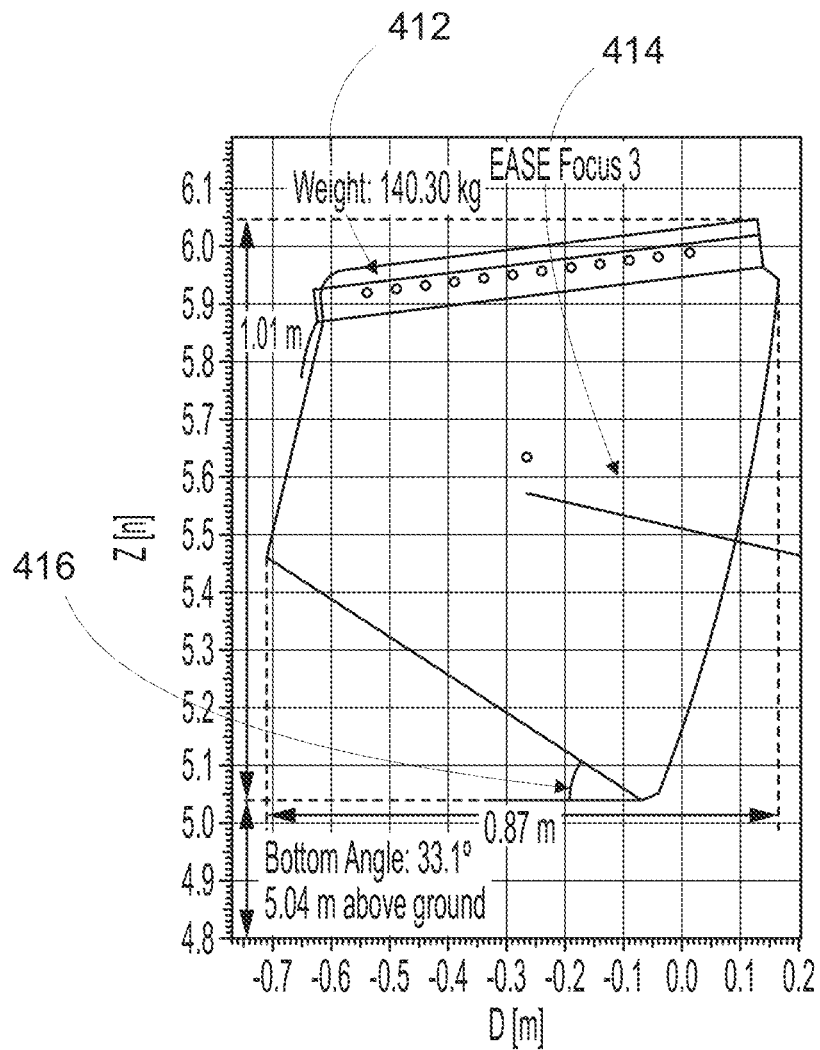
FIG. 4 illustrates a loudspeaker cabinet mounting configuration user interface according to example embodiments.

FIG. 4 illustrates an example graphical user interface of a single loudspeaker model according to example embodiments. Referring to FIG. 4, the example illustration includes a detailed schematic 400 of a loudspeaker cabinet 414 being configured with a mounting bracket 412 at a particular splay angle 416. The values may be varied to accommodate different polar spectrum goals.

The example embodiments may include an array setup including orientation/location of the array, a number of elements of speakers, a type/directivity of each element, a splay angle between elements and a magnitude and phase per frequency of each element. The system designers simply need to enter the acoustic goals/characteristics they need to achieve for the audience areas and the software application will then automatically calculate the number of cabinets required, cabinet types, splay angles between each cabinet, aiming angle for the entire array and, finally, will automatically select the passive acoustic filter setting for each cabinet to provide the most uniform response possible throughout the seating area.

The configuration application may collect the room geometry, speaker position, and the design target specified by the users. The array configurator algorithm analyzes the geometry of the room, mechanically configures a line array system (cabinet quantity, model, and splay angle) so that the acoustic radiation pattern of the loudspeakers matches the geometry of the room. The process may then provide multiple candidates, and after the line array is configured, passive acoustic filters can be utilized to optimize the system performance. This algorithm picks the one or few (out of millions of filter permutations) that achieve optimal performances based on the established criteria. Filter optimization is performed on each candidate and the optimum candidate is selected.

According to example embodiments, the process of identifying a definition of a sound source by using a venue's polar definition (venue polar) is provided. The venue polar is the ISL variation plotted against the angle variation of the venue area as viewed from the sound source location. This provides an ISL/angle function for the venue in units of dB/deg. Determining a mechanical array definition using the venue polar may include determining an acoustical summation of the array as a function of the directivities and the complex superposition variables of each element in space. The venue polar is used to generate a target for approximating a general intensity.

A first operation may include evaluating the venue polar by recognizing the change in ISL vs. angle (derivative of the venue polar or slope of the curve) to be directly proportional to the acoustical interaction of the modules. When the ISL derivative is a small number, the array needs to be in a constant curvature state using wide splay angles (no module interaction). When the numerical derivative is higher, the array requires high interaction to form beam structures with high intensity. The ISL derivative function 'F' can be used to create a splay angle definition function where: splay curve=K/(R*F), F=d/dθ(ISL), R=sqrt(r/min(r)), K=scaling constant. θ angle, and r=distance. The constant K permits the generated curve to scale for different array sizes and can work for any size array. R is used to implement a weighting function that references actual distance. R is the normalized to D1 (distance to closest seat in venue). D2 is the distance to the furthest seat in the venue. F is the ISL derivative in unit dB/deg. K in dB permits the splay angle to be measured in degrees. In one example, if K=−6 dB the splay curve can be identified. The loudspeaker pattern may be defined by −6 dB, for example, a 90 degree by 40 degree loudspeaker suggests its directivity is −6 dB at +/−45 degrees in the horizontal polar and +/−20 degrees in the vertical polar. That information can be translated dB/degree, such as −6/20=−0.3 for the vertical.

According to example embodiments, the use of the 'splay curve' to generate actual loudspeaker selections. The 'F*R' function represents a shape defined by the loudspeaker to audience distances and angles and has no reference to actual loudspeakers. The splay curve, however, (the inverse of 'F*R' multiplied by 'K' (scaling constant)) provides a translation and can track directly with loudspeaker selection and orientation angle. The localized directivity with K=−6 dB can be used as a basis to select actual loudspeakers, such as an autonomous selection and recommendation presented in a GUI, and to demonstrate where in the audience area of the venue certain loudspeaker configurations can operate successfully to achieve optimal sound distribution. The application can select a number of loudspeakers, loudspeaker types, orientation aiming of the entire array, and individual loudspeaker angle in the form of splay plate choice.

The application uses the inputted variables to first determine a target array size which is determined by direct calculations based on a target sound pressure level (SPL) output of the array, target low frequency control of the array, and if a preferred number of elements are predetermined (e.g., budget, architecture, etc.). The calculations set reasonable max/min values for the number of array elements and an array size range is established. With the array size min/max established, the program then iterates 'K' values. The unit 'K' has units of dB and thus the splay curve has units of angle as a design angle of the loudspeaker vertical directivity. The array must be required to cover the entire room which provides that its total coverage angle must be equal to a total angle of the venue polar (room geometry). If the splay curve is graphed vs. a venue polar angle, one can begin to match loudspeaker design angles to locations in the array. The application identifying a splay plate angle is actually an optimal design variable. The splay curve is implemented to possible splay plate values and compared vs. a venue polar angle. This now defines the number of and value of each splay plate that matches the corresponding location in the array. Rules are established for the iterative process to optimally fit with the product line (e.g., which plates match which loudspeakers and the basic rules about those selections). For instance, with one particular array type, the transition between choosing a five-degree box vs. a fifteen-degree box is a trigger point in the application. The program does this splay curve discretizing for each iterative K value and collects each unique array solution within the min/max array size range and total array angle requirement.

The number of loudspeaker elements used in a loudspeaker array is based on various factors. A particular directivity function can be achieved with numerous array sizes, types and splay angles. The splay curve calculations can produce a set of arrays of various sizes for a given venue polar by variation of 'K' values. The optimum loudspeaker array size may include a desired SPL, directivity frequency control range and the complexity of the audience area, among other considerations. User submitted input may be used as the basis for the target array size. The splay curves are then adjusted for the target size adjustments.

When selecting loudspeaker array characteristics, there are two types of modules for purposes of this example, one has 5 degree and the other 15 degree waveguides. There are four splay plates that allow [0, 1.25, 2.5, 5] degree splay angles when five degree cabinets are connected. The same splay plates produce [10, 11.25, 12.5, 15] degree splay angles when 15 degree cabinets are connected. The plates can also be used to mate 5 degree and 15 degree cabinets with [5, 6.25, 7.5, 10] degree splay angles. The splay curve must be quantized into the various angle options to best accommodate the target array size.

Performing the splay curve calculation is based on the information that can provide accurate and useful results. Different values of 'K' are evaluated to provide array configurations that are best for the shape of the venue polar. Narrowing down the potential solutions may be performed by identifying the most optimal 3-4 options. A target sound pressure level (SPL) may also be used as the basis for array selection. In a smaller auditorium the SPL may be 90 dBA and a larger stadium 105 dBA. Also, a last row offset angle may be used as a positive value that overshoots the last row and a negative number that undershoots the last row. This may be useful when there are overflow areas, standing areas, etc. behind the last row, or, in an undershoot scenario when a wall is present in the last row which could create reflections if the sound overshot the last row.

FIG. 5 illustrates a loudspeaker array configuration user interface according to example embodiments. Referring to FIG. 5, the user interface 500 is for reporting a loudspeaker array recommended configuration. The cabinets 512 are the types of loudspeakers in the array which may vary. The frame angle 516 is associated with each cabinet to be included in the array along with the splay angle 512. The attenuation 522/524 is also illustrated in dB.

Figure 6:
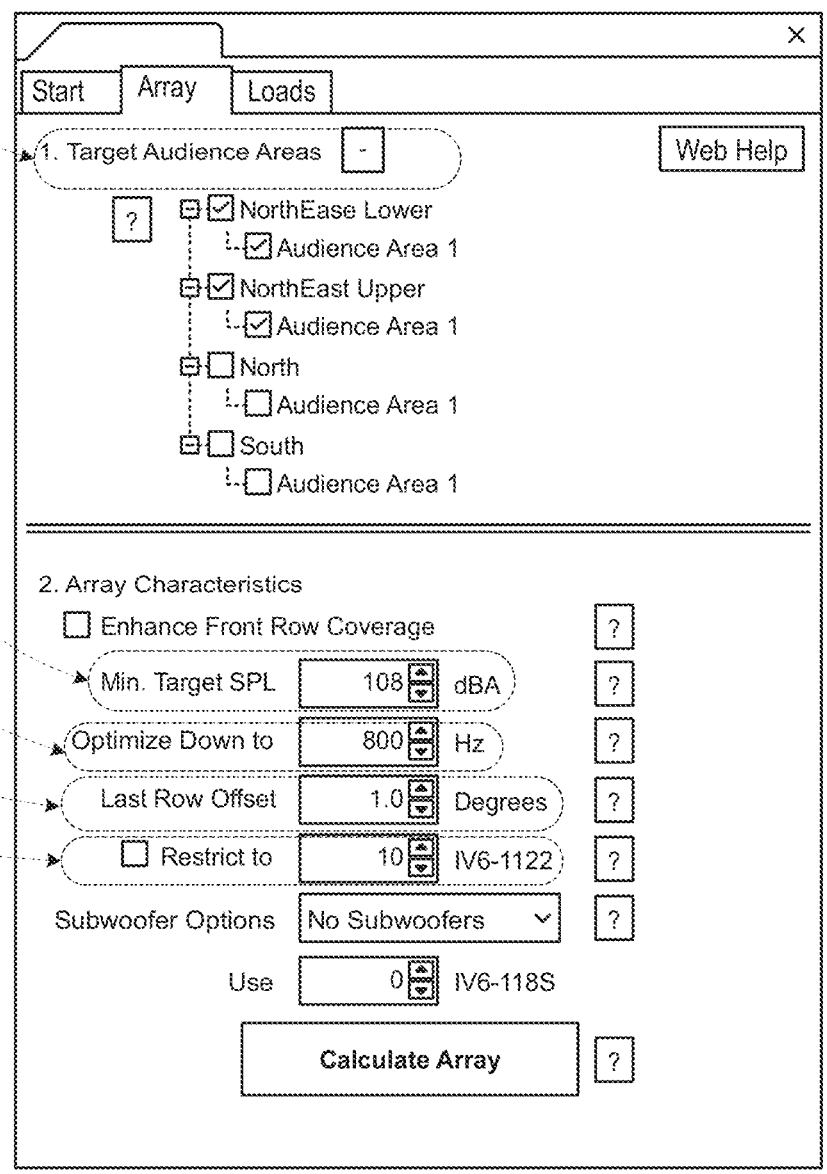
FIG. 6 illustrates another loudspeaker array configuration user interface according to example embodiments.

FIG. 6 illustrates another loudspeaker array configuration user interface according to example embodiments. Referring to FIG. 6, the user interface 600 include a target audience area(s) 610 alone with specific array characteristics, such as a minimum target sound pressure level (SPL) 612, an optimization level in Hz 614, a last row offset in degrees 616 and a type of cabinet and quantity option 618.

Once the loudspeaker cabinet selection criteria is identified along with the splay angles, aiming angles and other criteria, the passive acoustic filters to apply must be identified and applied based on optimization criteria. There may be a large number of choices, in this example, there are 55 choices for passive acoustic filters, this provides an exponential number of calculations, such as 55 to the power of the number of cabinets, so four loudspeakers would yield 55 to the power of 4 or 9,150,625 possibilities of filter permutations. The one filter selection that provides the best performance is selected and the second, third best, etc., may also be displayed in a user interface.

Figure 7:
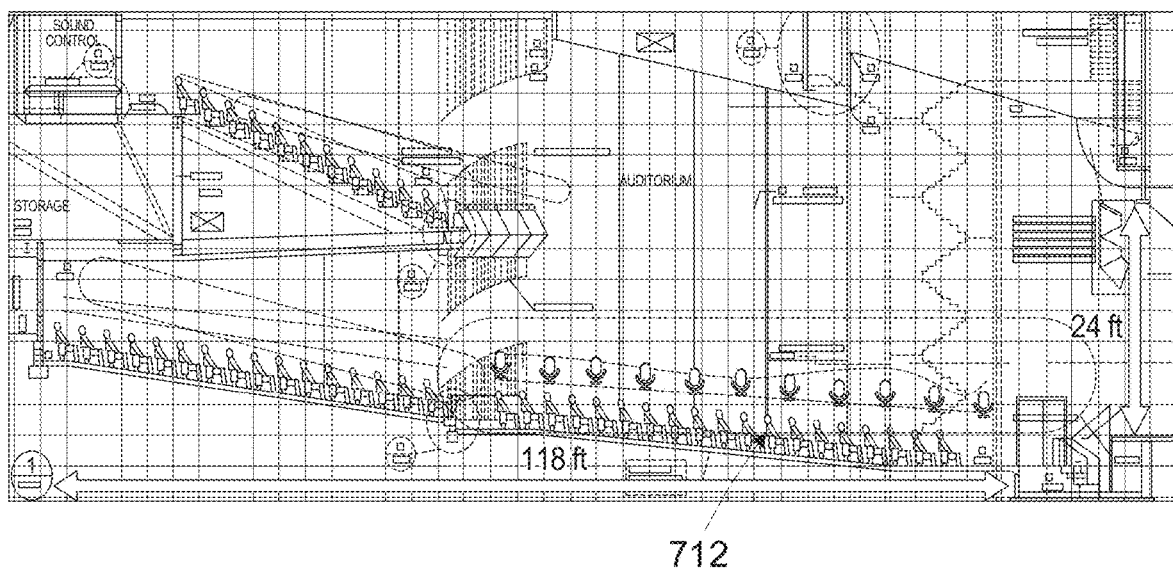
FIG. 7 illustrates a virtual receiver configuration user interface for identifying audio characteristics of a venue geometry according to example embodiments.

FIG. 7 illustrates a virtual receiver configuration user interface for identifying audio characteristics of a venue geometry according to example embodiments. Referring to FIG. 7, the venue 700 is illustrates as a virtual environment with a set of virtual receivers/microphones 712 which are setup a set distance (i.e., 1 meter apart) in an area of interest, such as a geometry being analyzed for audio characteristics. The procedure to identify the ideal filter configuration requires a basis for comparison to identify a coverage uniformity that is best suited for the geometry being analyzed. Evenly placed virtual receivers 712 may be simulated for all audience areas of interest. In this example, the virtual receivers are on a single axis with 1 meter of spacing.

The procedure may include calculating an octave band sound pressure level (SPL) at each virtual receiver 712, then calculate the standard deviation (STD). The filter setting that has the lowest STD at 4 kHz—3 octave may be considered the most optimal filter setting for purposes of this example. The STD may be calculated using one filter setting, then a summation using magnitude and phase balloons may be used. In order to avoid iterating through the filter setting, an optimization procedure that dynamically reduces the size of the permutations must be performed. For each cabinet having 10 filters, the filter index (0-9) may provide '0' having no attenuation and '9' having the most attenuation. The linear growth (attenuation over filter index is a linear growth) of four cabinets would naturally have 10×10×10×10=10000 filter settings (i.e., 0000-9999). One approach is to remove acoustically redundant filter settings, in one example, that would include filter settings where the values are all the same for all four cabinets (A,B,C,D), 0,0,0,0, 1,1,1,1, 2,2,2,2, 9,9,9,9, etc. In another example, the settings may be considered redundant if the same value is added or subtracted from the filter index of each group. For example, four cabinets with respective values 4,7,9,5 would have a minus one value of 3,6,8,4 and an additional minus one value of 2,5,7,3 and minus two of 0,3,5,1. The uniform changes across all cabinets would be redundant so those values can be removed as well. Each cabinet can be 0-9 and when the value of one cabinet is different from another, the changes thereafter can be redundant if evenly modified. In this example, at least one of the four digits must be '0' to remove redundancy.

Continuing with the same example, the optimization process may start with index 0,0,0,0 and end with some set of values A, B, C, D provided that each of those values is an acoustical critical point when compared on a graph. In this example, at least one value is '0'. This initial approach already takes 10000 potential options and reduces it to 4000. However, this process can include additional operations to reduce the overall number of needed permutations. In order to identify the acoustic critical point (ACP) the filter index one on cabinet, the value of one cabinet can be increased from 0 to 9 while the others are left unchanged.

In one example, S(i) is the function of STD over a filter index (i), and if a mathematical critical point exists within [0,9], it can be inferred that there is one and only one critical point. The acoustic critical point $(i_{ac})$=mathematical critical point and $i_{ac}$ must satisfy: $S(i_{ac})<S(i_{ac}-1)$ and $S(i_{ac})<S(i_{ac}+1)$. If a mathematical critical point does not exist, if STD $(0)\leq STD(1)$, then the function is either increasing or flat within [0,9], let $i_{ac}$=0. If std(0)>std(1), then the function is decreasing within [0,9], let $i_{ac}$=9. The acoustic critical point (ACP) can be easily identified from a graph of STD(dB) as the y-axis vs. the filter index as the x-axis, in this example 0-9. As the value continues to increase in a linear manner (positive slope), the first value will be the lowest STD, if the linear path is downward the lowest STD will be the last value of calculated (negative slope) and if the graph is non-linear, then the lowest point identified will be the most optimal value.

Identifying the ACP permits the procedure to dynamically reduce permutation size. The definition of an optimized filter setting provide a filter setting (A)(B)(C)(D), if A, B, C and D are all ACP, then (A)(B)(C)(D) is the optimized filter setting.

As a result, S[(A)(B)(C)(D)]<each of the items below:

S[(A+1)(B)(C)(D)]

S[(A−1)(B)(C)(D)]

S[(A)(B+1)(C)(D)]

S[(A)(B−1)(C)(D)]

S[(A)(B)(C+1)(D)]

S[(A)(B)(C−1)(D)]

S[(A)(B)(C)(D+1)]

S[(A)(B)(C)(D−1)].

A progressive path to identify the optimized filter setting may provide iterating from a bottom cabinet to a top cabinet. For example, for (A)(B)(C)(D), is D an ACP? If so, go to C, if not increase D by 1. Next, is C an ACP? If so, go to B, if not increase C by 1. Next, is B an ACP? If so, go to A, if not increase B by 1. Next, is A an ACP? If not, increase A by 1. Then, repeat the iteration until the optimize filter setting is identified.

Figure 8:
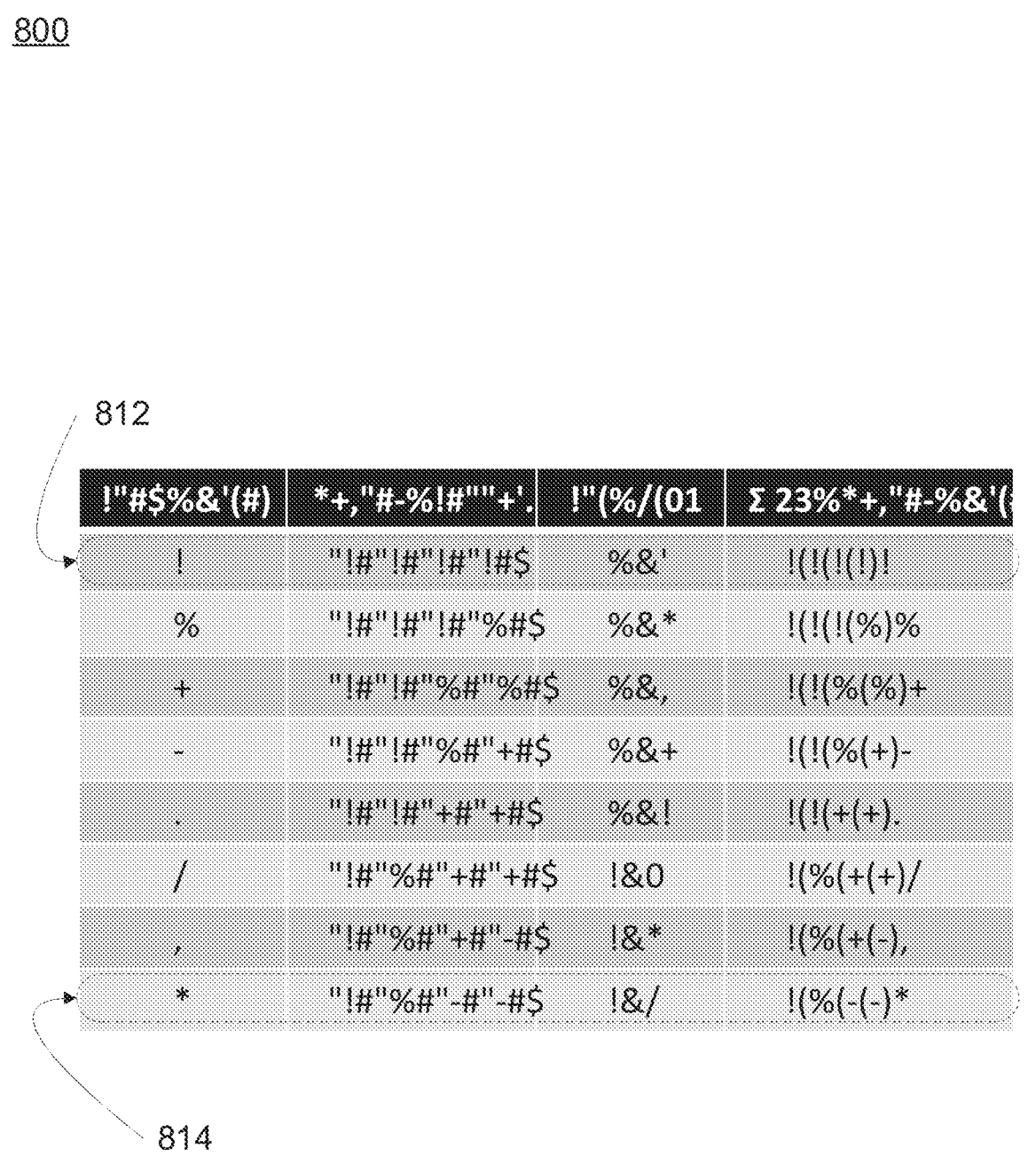

FIG. 8 illustrates a table user interface for identifying and calculating filter settings and reducing permutations according to example embodiments. Referring to FIG. 8, the table 800 includes an example 812 which illustrates a row with a step of '0' and filter settings of all zero. The STD is 1.9 dB and the sum is 0. When any filter index is increased by 1, the new filter setting is added to the series. The last row has an index of 7 and the STD is 0.5 and the filter index is 7. The last row is the most optimal value calculated up until this point. Given the examples for reducing permutations, the number of base operations per step has a best case scenario of '1' and a worst case value of '4'. The iteration is repeated until the optimized filter setting is found. A progressive path to identify the optimized filter setting may include a series of filter settings. Starting with (0)(0)(0)(0), and ending with the optimized filter setting. When any filter index is increased by 1, the new filter setting is added to the series. Each step taken, the STD is smaller than its predecessor. Each step dynamically reduces permutation size, at any step, Σ of filter index=step index and the number of base operations per step has a best result of '1' and a worst result of '4'. The fewest number of operations (best case is 1) when (0)(0)(0)(0) is the optimized filter setting. The most number of operations (worst case) is 27 when (0)(9)(9)(9) or (9)(0)(9)(9) or (9)(9)(0)(9) or (9)(9)(9)(0) is the optimized filter setting. The worst case number of base operations is 27×4 which is 108 base operations. For four cabinets (see table 900 in FIG. 9) 108 base operations for 10 filter values (0-9) is far fewer than the traditional approach of performing thousands of operations.

In the worst case computation scenario, the expression for filter computations may provide a number of cabinets=n (2≤n≤24), a number of filters=k, and the number of base operations per step=n, and the number of steps=(k−1)*(n−1); $T_{(n)}=n*(k-1)*(n-1)$. The non-optimized approach does not reduce permutations and would require: $T_{(n)}=(k^n)$. FIG. 9 illustrates another table user interface for identifying and calculating filter settings and reducing permutations according to example embodiments. Referring to FIG. 9, optimized approach for 4 cabinets (912) yields 108 operations. For 10 cabinets the operations is equal to 810 (914).

Figure 10:
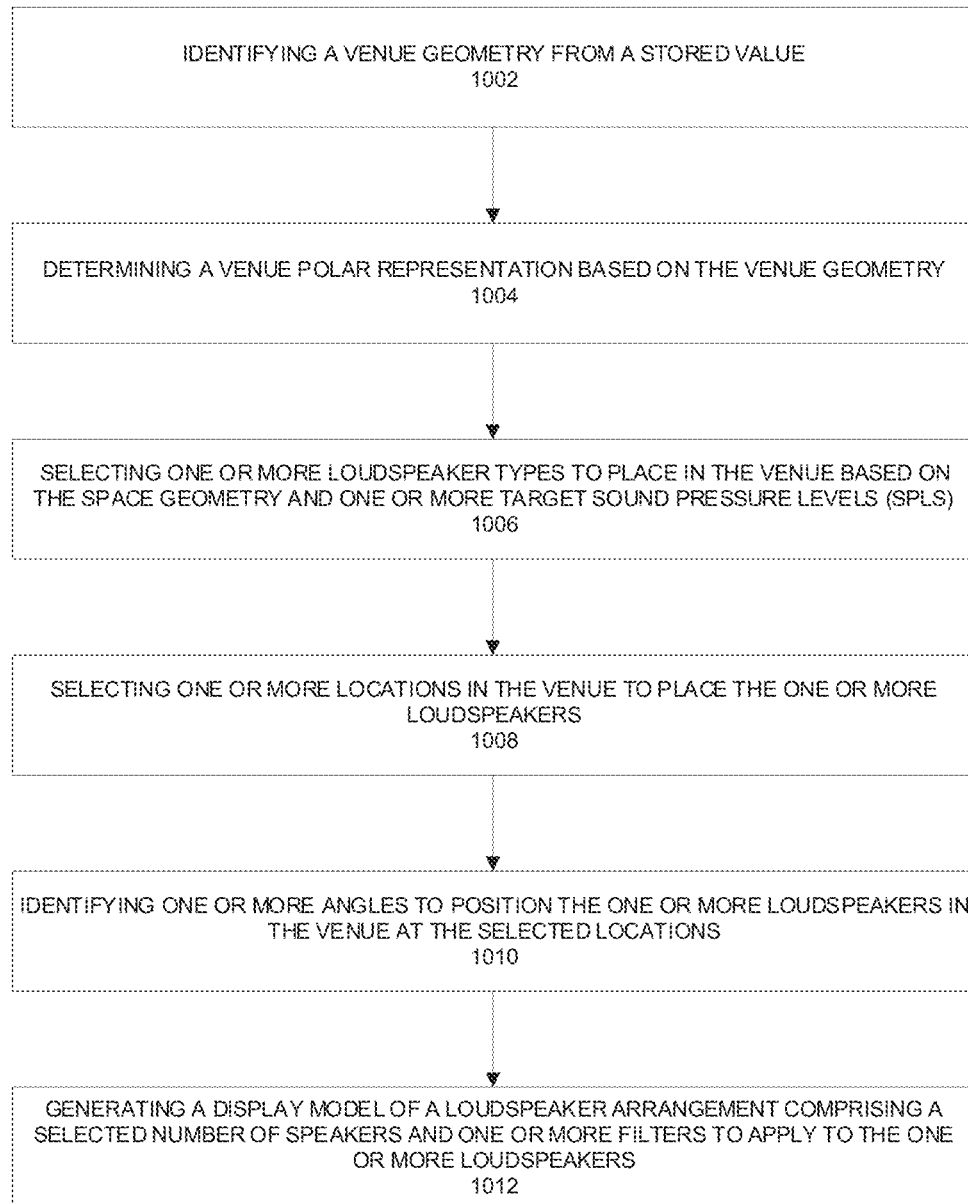
FIG. 10 illustrates a flow diagram for a loudspeaker array configuration according to example embodiments.

FIG. 10 illustrates a flow diagram for a loudspeaker array configuration according to example embodiments. Referring to FIG. 10, the flow diagram 1000 provides identifying a venue geometry from a stored value 1002, determining a venue polar representation based on the venue geometry 1004, selecting one or more loudspeaker types to place in the venue based on the space geometry and one or more target sound pressure levels (SPLs) 1006, selecting one or more locations in the venue to place the one or more loudspeakers 1008, identifying one or more angles to position the one or more loudspeakers in the venue at the selected locations 1012, and generating a display model of a loudspeaker arrangement comprising a selected number of speakers and one or more filters to apply to the one or more loudspeakers 1014. The space geometry may include a sum of a plurality of volumes. The venue polar representation is based on a ratio of a distance from the loudspeaker to a furthest seat in venue divided by a distance from the loudspeaker to a closest seat in venue. The identifying the one or more angles to position the one or more loudspeakers comprises selecting a frame angle to mount the one or more loudspeakers and a splay angle to position the one or more loudspeakers within their respective cabinets based on the target. The process may also include determining the splay angle to apply to the loudspeaker based on a scaling constant divided by the derivate of the angle between the front row and the last row and identifying a plurality of different target sound pressure level (SPL) to achieve in the space geometry when the geometry yields a plurality of last row offset angles, and identifying a first of the one or more loudspeaker types as a first candidate for the display model and a second of the one or more loudspeaker types as a second candidate for the display model, wherein the second loudspeaker type has a larger number of speakers inside its cabinet housing than a number of speakers inside a cabinet of the first loudspeaker type, and wherein a splay angle of the first loudspeaker type is larger than a splay angle of the second loudspeaker type. The selecting of the one or more locations in the venue to place the one or more loudspeakers includes determining an optimal distance between the first loudspeaker type and the second loudspeaker type to achieve the target sound pressure level (SPL).

FIG. 11 illustrates a flow diagram for a loudspeaker array configuration according to example embodiments. Referring to FIG. 11, the process 1100 includes identifying a loudspeaker array profile defining characteristics of a loudspeaker array stored in memory 1102, identifying a three-dimensional venue geometry value stored in the memory 1104, defining a plurality of virtual receivers to simulate acoustic characteristics within the venue geometry 1106, defining a number of passive acoustic filter permutations to perform within a range of passive acoustic filter settings, and each passive acoustic filter setting is unique and comprises one or more passive acoustic filters to apply to one or more loudspeakers in the loudspeaker array 1108, selecting performance criteria to apply to the loudspeaker array to represent its sound coverage uniformity at a given location throughout the venue geometry 1110, calculating the performance criteria of the loudspeaker array via a passive acoustic filter setting selected from one or more of the passive acoustic filter permutations by performing a simulation with the passive acoustic filter settings 1112, identifying an optimized passive acoustic filter setting from a specific permutation, with which the loudspeaker array achieves optimal uniform sound coverage in the venue geometry 1114, and applying the optimized passive acoustic filter setting to the loudspeaker array 1116.

The passive acoustic filter permutations are dependent on the loudspeaker quantity of the array and the passive acoustic filter quantity applied on each loudspeaker. The passive acoustic filter permutations size is the passive acoustic filter quantity raised to the power of the loudspeaker quantity of the array. The performance criteria is a standard deviation of direct field sound pressure level as calculated at the plurality of virtual receivers used in an acoustic characteristic simulation, and the loudspeaker array includes a plurality of loudspeakers, one or more loudspeaker models, a loudspeaker array position, one or more loudspeaker positions, one or more aiming angles, and one or more splay angles. The process may include identifying passive acoustic filter settings in the permutations that are acoustically redundant, and performing the permutations without the redundant permutations.

The process may also include dynamically converging towards an optimal passive acoustic filter setting so that each simulation cycle has an increased coverage uniformity with optimal performance criteria over a previous simulation cycle, establishing an optimization set of passive acoustic filter settings with each filter setting demonstrating a higher performance loudspeaker setting than a previously calculated setting, selecting a last setting in a set of identified settings as the optimized passive acoustic filter setting, and defining and using an acoustic critical point to identify the optimized passive acoustic filter setting. Additionally, the types of loudspeakers, cabinets and array structures may vary, and the manufacturers and models may also vary depending on the requirements of the venue and the selection options available at the time.

The operations of a method or algorithm described in connection with the embodiments disclosed herein may be embodied directly in hardware, in a computer program executed by a processor, or in a combination of the two. A computer program may be embodied on a computer readable medium, such as a storage medium. For example, a computer program may reside in random access memory ("RAM"), flash memory, read-only memory ("ROM"), erasable programmable read-only memory ("EPROM"), electrically erasable programmable read-only memory ("EEPROM"), registers, hard disk, a removable disk, a compact disk read-only memory ("CD-ROM"), or any other form of storage medium known in the art.

Figure 12:
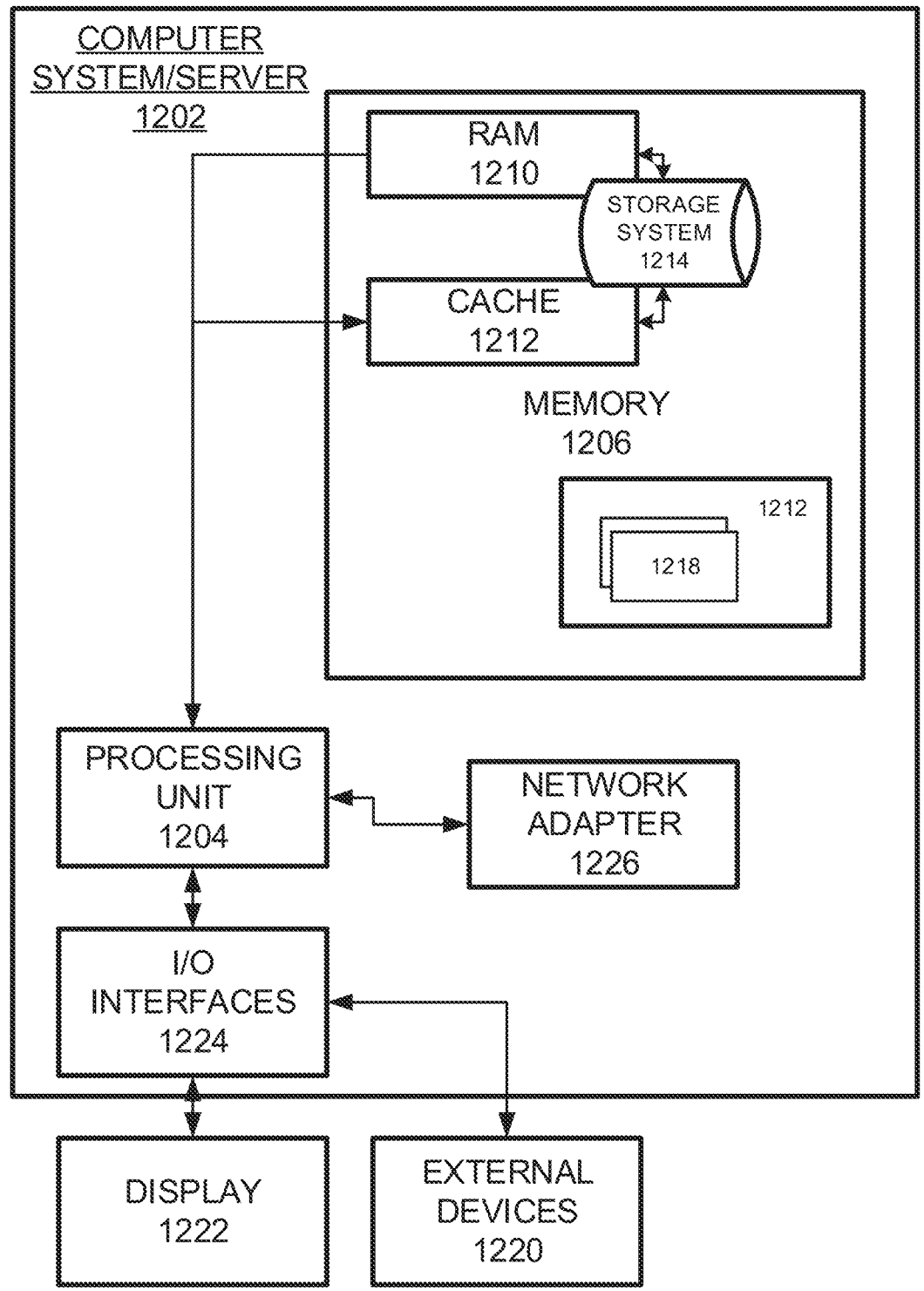
FIG. 12 illustrates a system configuration of a computer readable medium according to example embodiments.

FIG. 12 is not intended to suggest any limitation as to the scope of use or functionality of embodiments of the application described herein. Regardless, the computing node 1200 is capable of being implemented and/or performing any of the functionality set forth hereinabove.

In computing node 1200 there is a computer system/server 1202, which is operational with numerous other general purpose or special purpose computing system environments or configurations. Examples of well-known computing systems, environments, and/or configurations that may be suitable for use with computer system/server 1202 include, but are not limited to, personal computer systems, server computer systems, thin clients, rich clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1202 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 1202 may be practiced in distributed cloud computing environments where tasks are performed by remote processing devices that are linked through a communications network. In a distributed cloud computing environment, program modules may be located in both local and remote computer system storage media including memory storage devices.

As displayed in FIG. 12, computer system/server 1202 in cloud computing node 1200 is displayed in the form of a general-purpose computing device. The components of computer system/server 1202 may include, but are not limited to, one or more processors or processing units 1204, a system memory 1206, and a bus that couples various system components including system memory 1206 to processor 1204.

The bus represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 1202 typically includes a variety of computer system readable media. Such media may be any available media that is accessible by computer system/server 1202, and it includes both volatile and non-volatile media, removable and non-removable media. System memory 1206, in one embodiment, implements the flow diagrams of the other figures. The system memory 1206 can include computer system readable media in the form of volatile memory, such as random-access memory (RAM) 1210 and/or cache memory 1212. Computer system/server 1202 may further include other removable/non-removable, volatile/non-volatile computer system storage media. By way of example only, storage system 1214 can be provided for reading from and writing to a non-removable, non-volatile magnetic media (not displayed and typically called a "hard drive"). Although not displayed, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus by one or more data media interfaces. As will be further depicted and described below, memory 1206 may include at least one program product having a set (e.g., at least one) of program modules that are configured to carry out the functions of various embodiments of the application.

Program/utility 1216, having a set (at least one) of program modules 1218, may be stored in memory 1206 by way of example, and not limitation, as well as an operating system, one or more application programs, other program modules, and program data. Each of the operating system, one or more application programs, other program modules, and program data or some combination thereof, may include an implementation of a networking environment. Program modules 1218 generally carry out the functions and/or methodologies of various embodiments of the application as described herein.

As will be appreciated by one skilled in the art, aspects of the present application may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in one or more computer readable medium(s) having computer readable program code embodied thereon.

Computer system/server 1202 may also communicate with one or more external devices 1220 such as a keyboard, a pointing device, a display 1222, etc.; one or more devices that enable a user to interact with computer system/server 1202; and/or any devices (e.g., network card, modem, etc.) that enable computer system/server 1202 to communicate with one or more other computing devices. Such communication can occur via I/O interfaces 1224. Still yet, computer system/server 1202 can communicate with one or more networks such as a local area network (LAN), a general wide area network (WAN), and/or a public network (e.g., the Internet) via network adapter 1226. As depicted, network adapter 1226 communicates with the other components of computer system/server 1202 via a bus. It should be understood that although not displayed, other hardware and/or software components could be used in conjunction with computer system/server 1202. Examples include, but are not limited to: microcode, device drivers, redundant processing units, external disk drive arrays, RAID systems, tape drives, and data archival storage systems, etc.

One skilled in the art will appreciate that a "system" could be embodied as a personal computer, a server, a console, a personal digital assistant (PDA), a cell phone, a tablet computing device, a smartphone or any other suitable computing device, or combination of devices. Presenting the above-described functions as being performed by a "system" is not intended to limit the scope of the present application in any way but is intended to provide one example of many embodiments. Indeed, methods, systems and apparatuses disclosed herein may be implemented in localized and distributed forms consistent with computing technology.

It should be noted that some of the system features described in this specification have been presented as modules, in order to more particularly emphasize their implementation independence. For example, a module may be implemented as a hardware circuit comprising custom very large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together but may comprise disparate instructions stored in different locations which, when joined logically together, comprise the module and achieve the stated purpose for the module. Further, modules may be stored on a computer-readable medium, which may be, for instance, a hard disk drive, flash device, random access memory (RAM), tape, or any other such medium used to store data.

Indeed, a module of executable code could be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network.

It will be readily understood that the components of the application, as generally described and illustrated in the figures herein, may be arranged and designed in a wide variety of different configurations. Thus, the detailed description of the embodiments is not intended to limit the scope of the application as claimed but is merely representative of selected embodiments of the application.

One having ordinary skill in the art will readily understand that the above may be practiced with steps in a different order, and/or with hardware elements in configurations that are different than those which are disclosed. Therefore, although the application has been described based upon these preferred embodiments, it would be apparent to those of skill in the art that certain modifications, variations, and alternative constructions would be apparent, While preferred embodiments of the present application have been described, it is to be understood that the embodiments described are illustrative only and the scope of the application is to be defined solely by the appended claims when considered with a full range of equivalents and modifications (e.g., protocols, hardware devices, software platforms etc.) thereto.

What is claimed:

1. A method, comprising:
defining a range of passive acoustic filter settings, wherein each passive acoustic filter setting comprises one or more passive acoustic filters to apply to one or more loudspeakers in a loudspeaker array;
calculating a performance criteria of the loudspeaker array by performing a simulation with the passive acoustic filter settings;
identifying the passive acoustic filter setting, with which the loudspeaker array achieves optimal uniform sound coverage in a venue; and
applying the passive acoustic filter setting to the loudspeaker array.

2. The method of claim 1, wherein the passive acoustic filter setting is dependent on a passive acoustic filter quantity of the one or more loudspeakers.

3. The method of claim 1, wherein the loudspeaker array comprises a plurality of loudspeakers, one or more loudspeaker models, a loudspeaker array position, one or more loudspeaker positions, one or more aiming angles, and one or more splay angles.

4. The method of claim 3, comprising performing the passive acoustic filter settings that are not acoustically redundant.

5. The method of claim 1, comprising identifying the passive acoustic filter settings that are acoustically redundant.

6. The method of claim 1, comprising
dynamically converging towards an optimal passive acoustic filter setting so that each cycle of the simulation has an increased coverage uniformity with optimal performance criteria over a previous simulation cycle;
establishing an optimization set of passive acoustic filter settings with each filter setting demonstrating a higher performance loudspeaker setting than a previously calculated setting; and
selecting a last setting in a set of identified settings as the optimal passive acoustic filter setting.

7. The method of claim 6, comprising
defining and using an acoustic critical point to identify the optimal passive acoustic filter setting.

8. An apparatus, comprising
a processor configured to
define a range of passive acoustic filter settings, wherein each passive acoustic filter setting comprises one or more passive acoustic filters to apply to one or more loudspeakers in a loudspeaker array;
calculate a performance criteria of the loudspeaker array by performing a simulation with the passive acoustic filter settings;
identify the passive acoustic filter setting, with which the loudspeaker array achieves optimal uniform sound coverage in a venue; and
apply the passive acoustic filter setting to the loudspeaker array.

9. The apparatus of claim 8, wherein the passive acoustic filter setting is dependent on a passive acoustic filter quantity of the one or more loudspeakers.

10. The apparatus of claim 8, wherein the loudspeaker array comprises a plurality of loudspeakers, one or more loudspeaker models, a loudspeaker array position, one or more loudspeaker positions, one or more aiming angles, and one or more splay angles.

11. The apparatus of claim 10, wherein the processor is further configured to perform the passive acoustic filter settings that are not acoustically redundant.

12. The apparatus of claim 8, wherein the processor is further configured to identify the passive acoustic filter settings that are acoustically redundant.

13. The apparatus of claim 8, wherein the processor is further configured to dynamically converge towards an optimal passive acoustic filter setting so that each cycle of the simulation has an increased coverage uniformity with optimal performance criteria over a previous simulation cycle;

establish an optimization set of passive acoustic filter settings with each filter setting demonstrating a higher performance loudspeaker setting than a previously calculated setting; and select a last setting in a set of identified settings as the optimal passive acoustic filter setting.

14. The apparatus of claim 13, wherein the processor is further configured to define and use an acoustic critical point to identify the optimal passive acoustic filter setting.

15. A non-transitory computer readable storage medium configured to store instructions that when executed cause a processor to perform:

defining a range of passive acoustic filter settings, wherein each passive acoustic filter setting comprises one or more passive acoustic filters to apply to one or more loudspeakers in a loudspeaker array;

calculating a performance criteria of the loudspeaker array by performing a simulation with the passive acoustic filter settings;

identifying the passive acoustic filter setting, with which the loudspeaker array achieves optimal uniform sound coverage in a venue; and applying the passive acoustic filter setting to the loudspeaker array.

16. The non-transitory computer readable storage medium of claim 15, wherein the passive acoustic filter setting is dependent on a passive acoustic filter quantity of the one or more loudspeakers.

17. The non-transitory computer readable storage medium of claim 15, wherein the loudspeaker array comprises a plurality of loudspeakers, one or more loudspeaker models, a loudspeaker array position, one or more loudspeaker positions, one or more aiming angles, and one or more splay angles.

18. The non-transitory computer readable storage medium of claim 17, comprising performing the passive acoustic filter settings that are not acoustically redundant.

19. The non-transitory computer readable storage medium of claim 15, comprising identifying the passive acoustic filter settings that are acoustically redundant.

20. The non-transitory computer readable storage medium of claim 15, wherein the processor is further configured to perform:

dynamically converging towards an optimal passive acoustic filter setting so that each cycle of the simulation has an increased coverage uniformity with optimal performance criteria over a previous simulation cycle;

establishing an optimization set of passive acoustic filter settings with each filter setting demonstrating a higher performance loudspeaker setting than a previously calculated setting; and selecting a last setting in a set of identified settings as the optimal passive acoustic filter setting.

\* \* \* \* \*